(12) United States Patent
Godet et al.

(10) Patent No.: US 9,118,001 B2
(45) Date of Patent: Aug. 25, 2015

(54) TECHNIQUES FOR TREATING SIDEWALLS OF PATTERNED STRUCTURES USING ANGLED ION TREATMENT

(71) Applicant: Varian Semiconductor Equipment Associates, Inc., Gloucester, MA (US)

(72) Inventors: Ludovic Godet, Boston, MA (US); Daniel Distaso, Merrimac, MA (US); John J. Hautala, Beverly, MA (US); Christopher Campbell, Newburyport, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 9 days.

(21) Appl. No.: 13/933,325

(22) Filed: Jul. 2, 2013

(65) Prior Publication Data
US 2014/0017817 A1 Jan. 16, 2014

Related U.S. Application Data

(60) Provisional application No. 61/670,590, filed on Jul. 11, 2012.

(51) Int. Cl.
*H01L 43/12* (2006.01)
*H01J 37/32* (2006.01)
*H01L 21/02* (2006.01)
*H01L 21/3213* (2006.01)

(52) U.S. Cl.
CPC ............ *H01L 43/12* (2013.01); *H01J 37/32357* (2013.01); *H01J 37/32422* (2013.01); *H01J 37/32623* (2013.01); *H01L 21/02071* (2013.01); *H01L 21/32131* (2013.01)

(58) Field of Classification Search
None
See application file for complete search history.

(56) References Cited

U.S. PATENT DOCUMENTS 8,460,569 B2 * 6/2013 Godet et al. .............. 216/87
2012/0213941 A1 8/2012 Steen et al.

* cited by examiner

*Primary Examiner* — Scott B Geyer

(57) ABSTRACT

In one embodiment a method of method of treating a sidewall layer of a patterned feature includes providing the patterned feature as an etched structure comprising one or more layers disposed on a substrate and generally parallel to a plane of the substrate defined by a front surface of the substrate. The sidewall layer comprises material from the one or more etched layers. The method further includes arranging the substrate proximate a sheath modifier that is adjacent a plasma, and providing ions in an ion dose to the substrate by extracting the ions from the plasma through the sheath modifier, the ions impinging upon the substrate at an angle with respect to a perpendicular to the plane of the substrate.

17 Claims, 9 Drawing Sheets

TECHNIQUES FOR TREATING SIDEWALLS OF PATTERNED STRUCTURES USING ANGLED ION TREATMENT

This application claims priority to U.S. provisional patent application 61/670,590 filed Jul. 11, 2012.

BACKGROUND OF THE INVENTION

1. Field of the Invention

Embodiments relate to the field of non-volatile storage and more particularly to a method, system and structure for treating patterned device structures with ions.

2. Discussion of Related Art

In present day technology many advanced devices such as sensors, processors, and memory devices include three dimensional structures that are fabricated from multilayer structures formed on a substrate. The fabrication of final structures having the desired shape and size presents many challenges in part due to the often complex system of different materials used to form the multilayer structures as well, as the extremely small size of many device structures. To cite one example, in the area of magnetic memory, much recent effort has focused on developing magnetic random access memory (MRAM) by patterning an array of isolated magnetic memory cells. This patterning may be performed by lithographically defining mask features on a substrate and etching the substrate with the mask in place to define a two dimensional array of memory cells having a generally planar geometry similar to conventional semiconductor RAM memory devices. However, each magnetic memory cell is composed of multiple different layers, including magnetic layers, insulator layers, conducting non-magnetic layers, and so forth. To define each isolated three dimensional MRAM cell an entire stack of such layers must be etched in regions between the memory cells to be formed. Leaving aside the etching challenges inherent in simply etching through such a stack of heterogeneous materials, the final three dimensional etched cells may present a less than ideal structure. In particular, the three dimensional structures may have sidewall layers that form during the etching process and require subsequent removal. Such redeposition alters the critical dimension of memory structures being patterned. In addition, such layers may have unknown or variable composition that typically include metallic material that may not be easily etched using conventional approaches such as wet etching or reactive ion etching without compromising the final device structures. It is with respect to these and other considerations that the present improvements have been needed.

SUMMARY

Embodiments are directed to methods for treating sidewalls of patterned features. In one embodiment a method of treating a sidewall layer of a patterned feature includes providing the patterned feature as an etched structure comprising one or more layers disposed on a substrate and generally parallel to a plane of the substrate defined by a front surface of the substrate. The patterned feature includes a sidewall layer comprising material from the one or more etched layers. The method further includes arranging the substrate proximate a sheath modifier that is adjacent a plasma, and providing ions in an ion dose to the substrate by extracting the ions from the plasma through the sheath modifier, the ions impinging upon the substrate at an angle with respect to a perpendicular to a plane of the substrate.

DESCRIPTION OF EMBODIMENTS

Figure 1:
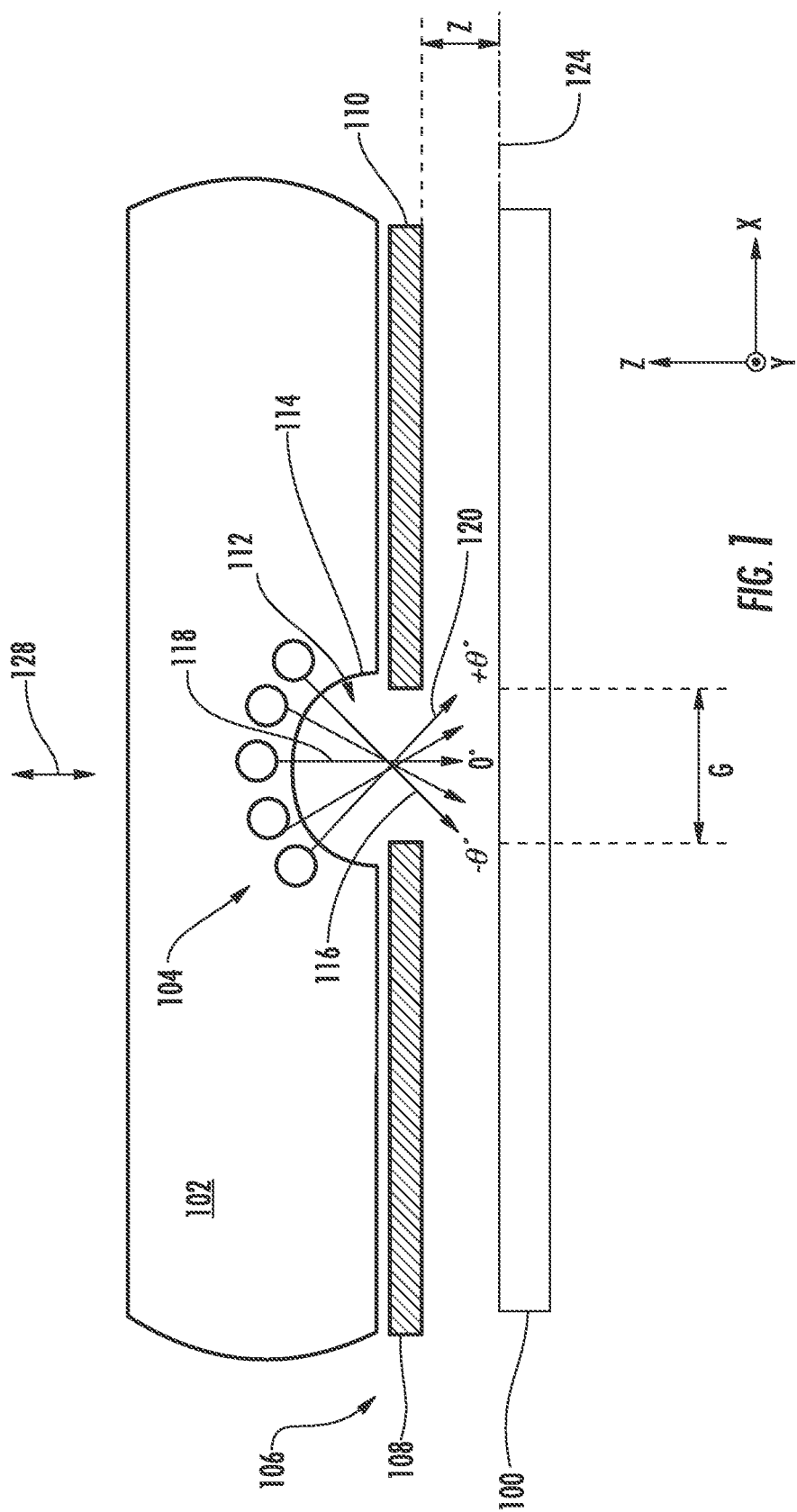
FIG. 1 shows geometry of an apparatus for producing angled ions.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for treating patterned features on a substrate are disclosed. Various embodiments are related to techniques and apparatus that employ angled ions to treat sidewalls of device structures such as patterned cell structures or "pillars" of MRAM devices. More generally, the techniques and apparatus disclosed herein may be used to treat patterned structures (also referred to as "patterned features") that contain stacks of multiple layers including metal layers in order to remove etch residue that results when the patterned structures are formed. Each patterned feature thus constitutes a plurality of etched layers that are patterned into a desired shape such as a pillar. The plurality of etched layers may include a plurality of metal layers such that the etch residue that forms a sidewall layer after etching may be metallic or metal-rich and may be difficult to etch properly using conventional reactive ion etching, gas phase etching or wet etching. A metal-rich layer may include non-metallic material such as oxygen, but may have a sufficiently high concentration of metal that it's etch properties and electrical conductivity are similar to metal layers. The present embodiments address various important problems that are found in present day etch technology for forming MRAM cell structures (also termed "pillars" herein). These problems include the formation of electrical shorts after pillar etching, including electrical shorts between layers in an MRAM pillar and electrical shorts between different MRAM pillars as noted above; the increase in critical dimension in MRAM pillars compared to mask CD due at least in part to redeposition on sidewalls of MRAM pillars during etching to form the pillars; lack of verticality of pillars, and variation in CD of pillars across a substrate (wafer) after etching to form the pillars.

FIG. 1 is a diagram of a portion of a plasma processing apparatus used to produce angled ions to treat a substrate (workpiece) 100. For clarity many components are not shown in order to illustrate the geometry of angled ions. The plasma 102 is generated as is known in the art. This plasma 102 is generally a quasi-neutral collection of ions and electrons. The ions typically have a positive charge while the electrons have a negative charge. In a system containing the plasma 102, ions 104 from the plasma 102 are attracted toward a workpiece 100. These ions 104 may be attracted with sufficient energy to be implanted into the workpiece 100. The plasma 102 is bounded by a region proximate the workpiece 100 referred to as a plasma sheath 112. A sheath modifier 106 is configured to modify an electric field within the plasma sheath 112 to control a shape of a boundary 114 between the plasma 102 and the plasma sheath 112. Accordingly, ions 104 that are attracted from the plasma 102 across the plasma sheath 112 may strike the workpiece 100 at a large range of incident angles. This sheath modifier 106 also may be referred to as, for example, a focusing plate or sheath engineering plate and may be a semiconductor, insulator, or conductor.

In the embodiment of FIG. 1, the sheath modifier 106 has two portions 108,110 defining an aperture therebetween having a horizontal spacing (G). The portions 108, 110 may be connected or may be a pair of sheets having a thin, flat shape. In other embodiments, the portions 108, 110 may be other shapes such as tube-shaped, wedge-shaped, and/or have a beveled edge proximate the aperture. The portions 108,110 also may be positioned a vertical spacing (Z) above the plane 124 defined by the front surface of the workpiece 100 and is generally parallel to the X-Y plane of the Cartesian coordinate system shown. In one embodiment, the vertical spacing (Z) may be about 1.0 to 10.0 mm.

Ions 104 may be attracted from the plasma 102 across the plasma sheath 112 toward the workpiece 100. Advantageously, the sheath modifier 106 modifies the electric field within the plasma sheath 112 to control a shape of the boundary 114 between the plasma 102 and the plasma sheath 112. The boundary 114 between the plasma 102 and the plasma sheath 112 may have a convex shape relative to the plane or another shape not parallel to the plane 124. When the workpiece 100 is biased, for example, the ions 104 are attracted across the plasma sheath 112 through the aperture defined by portions 108, 110 at a large range of incident angles. For instance, ions 104 following trajectory path 116 may strike the workpiece 100 at an angle of +θ° relative to a perpendicular 128 to the plane 124. Ions 104 following trajectory path 118 may strike the workpiece 100 at about an angle of 0° relative to the perpendicular 128 same plane 124. Ions 104 following trajectory path 120 may strike the workpiece 100 an angle of −θ° relative to the perpendicular 128 to plane 124. Accordingly, the range of incident angles may be between +θ° and −θ° centered about 0°. In addition, some ion trajectories paths such as trajectory paths 116 and 120 may cross each other. As used herein, the term "at an angle" without further qualification generally refers to a non-zero angle with respect to a perpendicular to a plane of the substrate. The term "at an angle" unless otherwise noted, may also denote a single angle or a range of angles at least some of which are not perpendicular to a plane of a substrate being impacted. Thus, when ions are provided to a substrate "at an angle" the ions may be provided over a range of angles including positive and negative angles with respect to a perpendicular that are effective to strike or impact opposite sidewalls of pillar structures.

In accordance with known procedures, parameters such as the spacing G, the vertical spacing (Z) of the sheath modifier 106 above plane 124, plasma power, and other parameters may be used to vary the distribution of angles of ions 104 incident upon the workpiece 100. In some instances the ions 104 may form a diverging beam having a distribution centered about zero degrees as shown in FIG. 1. In other instances the ion trajectories may form a bimodal distribution of ion angles that are centered about zero degrees but have two peaks of angles of incidence that are located at negative and positive angles with respect to zero. Many other distributions are possible.

Figure 2:
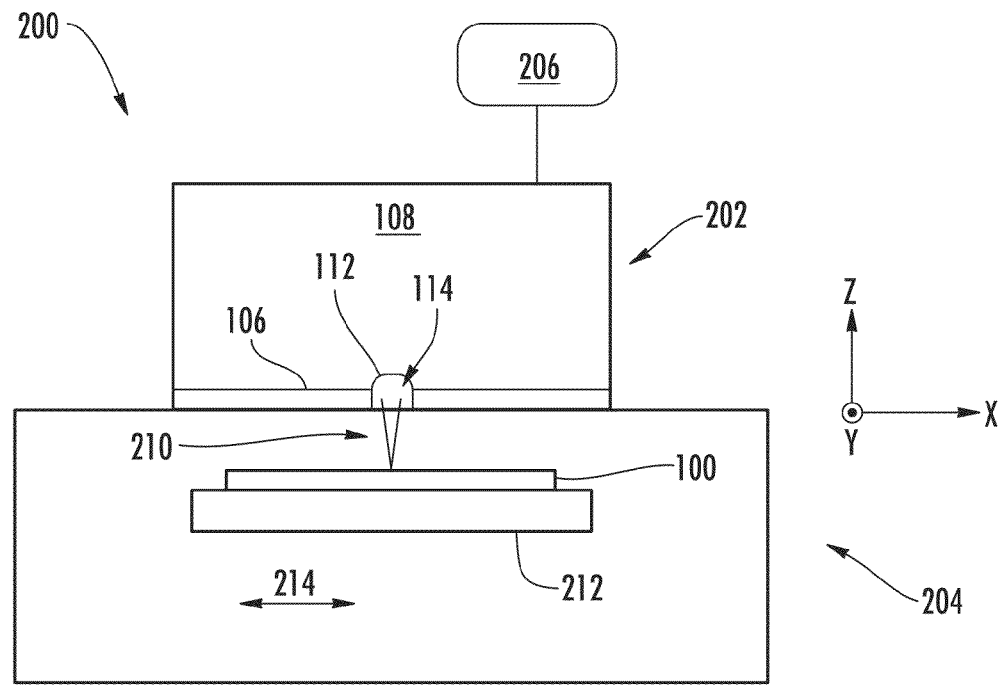
FIGS. 2 and 3 depict a side view and top view, respectively, of components of an ion processing apparatus that may be employed in the present embodiments.
Figure 3:
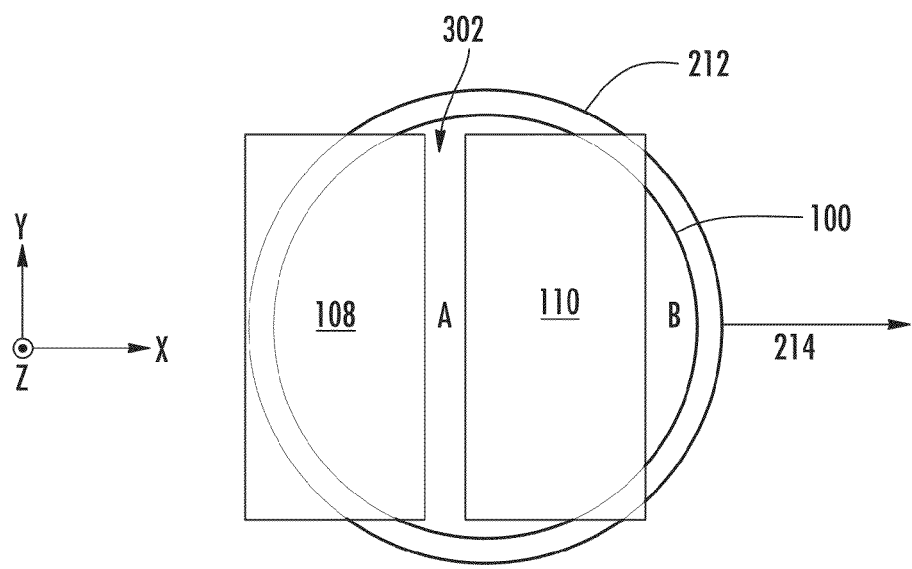

FIGS. 2 and 3 depict a side view and top review respectively, of a plasma processing apparatus that may be employed to treat device structures such as MRAM pillars in accordance with the present embodiments. The system 200 includes a plasma source 202, a sheath modifier 106, and a process chamber 204. A gas source 206 is connected to the plasma source 202. The plasma source 202 or other components of the system 200 also may be connected to a pump, such as a turbopump. The plasma source 202 that generates the plasma 102 may be, for example, an RF plasma source, inductively-coupled plasma (ICP) source, indirectly heated cathode (IHC), capacitively-coupled plasma (CCP) source, helicon plasma source, microwave plasma source, or other plasma sources known to those skilled in the art. The process chamber 204, plasma source 202, or platen 212 may be grounded. The extraction of ions 210 from the plasma source 202 may be continuous (DC) or pulsed. The plasma source 202 may be biased in one instance. Alternatively, an RF bias in the system 200 may or may not be pulsed.

The sheath modifier 106 design is not limited solely to the design illustrated in FIGS. 1-3. Adding more than one aperture 302 may increase throughput of the system 200. One or more workpieces 100, which may be semiconductor wafers, are arranged on a platen 212 in the process chamber 204. The platen 212 may use electrostatic clamping, mechanical clamping, or a combination of electrostatic and mechanical clamping to retain the workpiece 100. The workpiece 100 may be scanned using the platen 212. In the embodiment of FIG. 3, the platen 212 can scan in the direction 214. The platen 212, however, may perform either 1D, 2D, or 3D scanning or rotation depending on the desired implant pattern on the workpiece 100. In an alternate embodiment, the sheath modifier 106 translates with respect to the workpiece 100. Various load and unload mechanisms may be used to place the workpiece 100 on the platen 212. The platen 212 may be configured to provide backside gas cooling to the workpiece 100 in one instance. The workpiece 100 may be heated or cooled to various temperatures before or during implantation using the platen 212 or some other apparatus.

In the embodiments to follow techniques are disclosed that involve angled ion treatment of MRAM device structures using apparatus such as the system 200 or other ion implantation apparatus including beam line implantation apparatus. The embodiments are also described as techniques using ion based substrate processing systems. However, those of ordinary skill in the art will recognize that other types of sub-atomic, atomic, or molecular particle based substrate processing systems, including plasma processing, as well as beam line ion implantation systems used to produce such particles, are within the scope of the present disclosure.

Consistent with various embodiments, the ion dose, ion energy, angle of incidence of ions, range of angles of incidence of ions, and ion dose uniformity, are tailored in order to treat patterned device features. In the embodiments to follow, ion treatment of MRAM device structures in particular is detailed. However, the present embodiments cover ion treatment of other devices structures that exhibit the aforementioned problems, including redeposition on sidewalls, conductive residue in trench regions, non-uniformity of critical dimension across a wafer, and other problems In the particular embodiments shown, after etching is performed to form MRAM pillars angled ions are provided to remove sidewall material from the MRAM pillar. As noted above etching to form MRAM pillars may result in various unwanted side-effects including the deposition of material on the pillar sidewalls. Angled ions may be provided to selectively etch unwanted material formed during etching on pillar sidewalls while preserving the tops of pillars. In some embodiments, angled ions may further be provided to protect etched sidewalls after unwanted sidewall material is removed.

Figure 4:
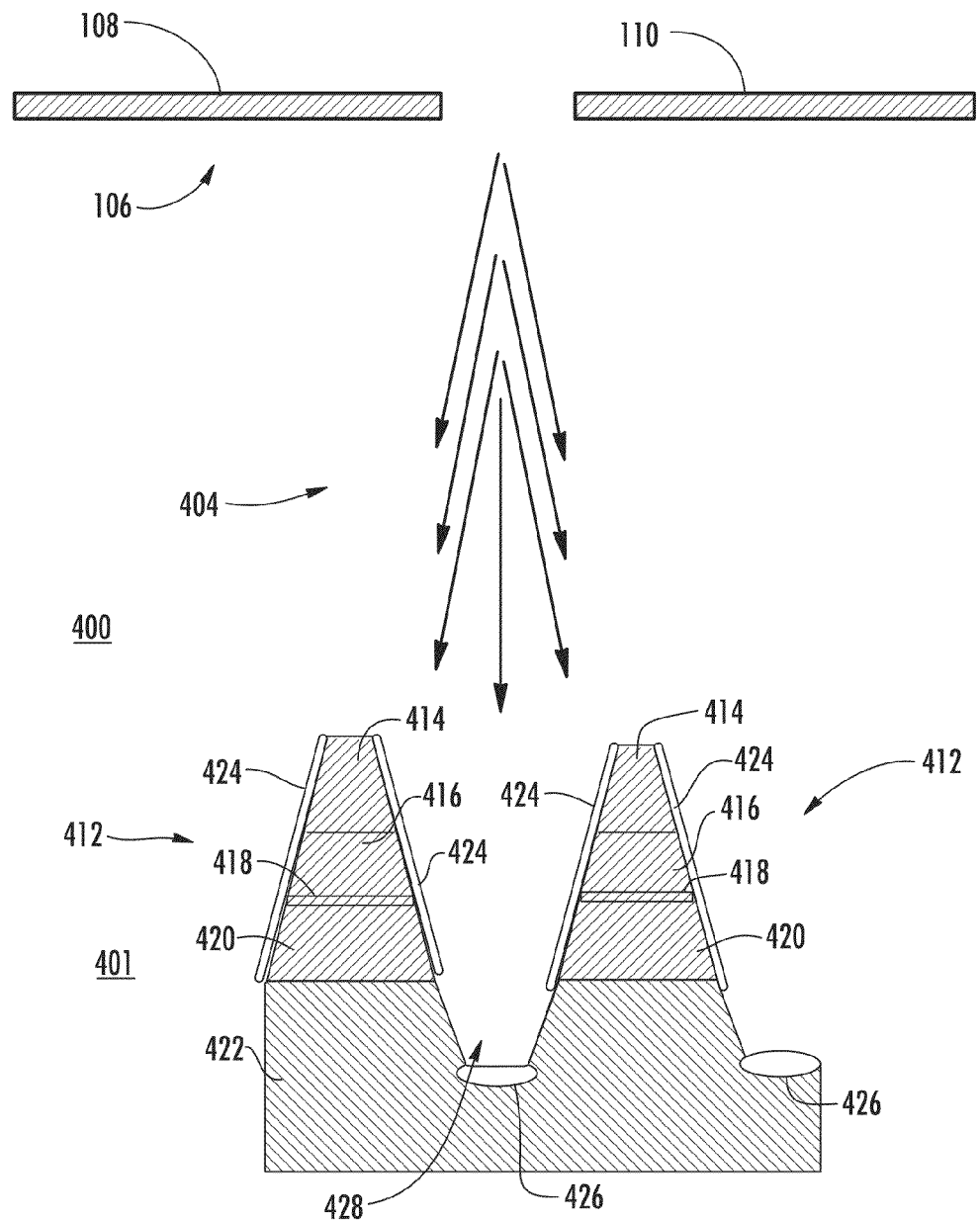
FIG. 4 depicts the general arrangement for processing a device pillar structure using angled ion treatment in accordance with the present embodiments.

FIG. 4 depicts general features of an arrangement 400 for providing ion treatment of an MRAM device consistent with various embodiments. In the arrangement 400, the MRAM device structure 402, which may be formed according to known deposition, patterning, and etch techniques, is subjected to ion treatment from ions 404. As illustrated the ions 404 are directed at the MRAM device structure 402 over a range of angles of incidence (also referred to herein as an "angular range"). The ions 404 may be provided, for example, by the system 200, which is represented by the sheath modifier 106, from which the ions 404 are extracted as detailed above. The MRAM device structure 402 exhibits two cells or pillars 412, although it will be appreciated that a full MRAM device may typically contain many billions of such structures. Each pillar 412 includes a hardmask layer 414, top magnetic layer 416, insulator 418, and bottom magnetic layer 420. Other layers such as contact layers are omitted for clarity. The MRAM device structure 402 is shown at a stage of formation subsequent to the completion of etching to define the individual MRAM pillars 412, which are in this example etched all the way to the substrate base layer 422. After etching, sidewall layers 424 are formed, which may contain metal material etched from the layers, 414, 416, 420, for example. In addition, a bottom region 426 is formed at the bottom of trench regions 428 between adjacent (MRAM) pillars 412. The bottom region 426 may be a combination of damaged or altered substrate material and redeposited material formed during etching to form the MRAM pillars 412. After etching, each pillar 412 thus constitutes in a central portion a plurality of etched layers that are generally parallel to one another and are bounded by a sidewall layer oriented at an angle with respect to the etched layers. Depending upon the angle of the sidewall after etching is completed the sidewall layer may be oriented at about zero degrees with respect to a perpendicular (also referred to herein as a normal") to a plane of the substrate (see plane 124), or about ten degrees, twenty degrees, or thirty degrees with respect to the perpendicular, to name a few examples. The embodiments are not limited in this context.

An advantage of providing angled ions is that, by virtue of controlling the direction (angle) or range of angles of the ions, etching can be selectively directed to those portions of a pillar where removal of material is desirable, such as on the sidewalls, regardless of the chemical nature of the sidewall material. This is especially advantageous in systems where the pillars may comprise multiple different materials including metal layers that are difficult to etch using reactive ion etching gas phase chemical etching or wet chemical etching.

Figure 5:
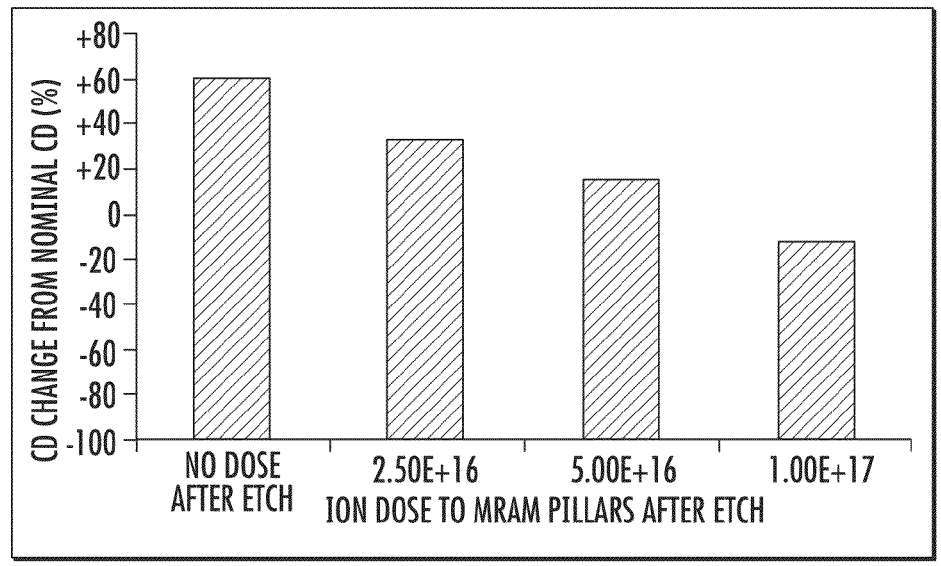
FIG. 5 depicts data showing the dependence of pillar critical dimension on ion dose for angled ion treatment consistent with the present embodiments.

FIG. 5 depicts experimental results of treating MRAM pillars after etching, in which angled argon ions are directed to the MRAM pillars using an apparatus similar to the system 200. The nominal CD measured in an array of MRAM pillars is shown as a function of ion dose applied to the MRAM pillars after pillar formation by conventional etching. As illustrated, after etching to form the pillars, the nominal CD increases by about 60%, which may be ascribed to redeposition of etch residue that forms a layer along the sidewalls of the pillars causing the pillars to increase in diameter. As noted, the etch residue material on the sidewalls may include one or more metal components, such as Pt, Cr, Mn, Co, Fe, Ta, and other metals. In the example of FIG. 5, the argon ions cause physical sputter etching of the sidewall material that takes place regardless of the composition of sidewall material. After an ion dose is applied to the MRAM pillars, the CD decreases with increasing ion dose. As illustrated, at an argon ion dose of 5E16, the CD is reduced so that the CD of the MRAM pillars is only about 10% greater than the nominal CD. At an argon ion dose of 1E17, the CD of MRAM pillars is about 10% less than the nominal CD.

Figure 6A:
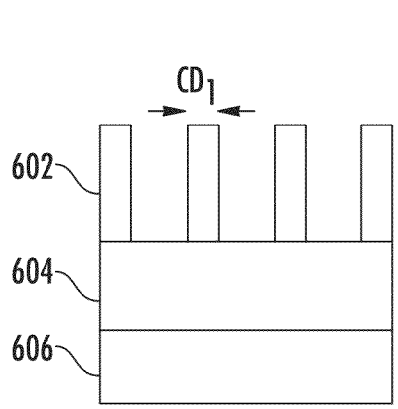
FIGS. 6A to 6C depict exemplary steps involved in processing a workpiece for formation of a pillar device structure according to an embodiment of the disclosure.
Figure 6B:
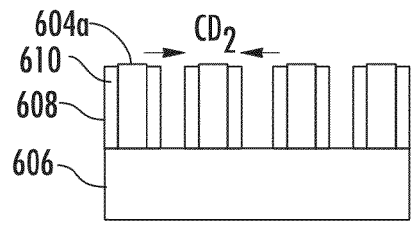
Figure 6C:
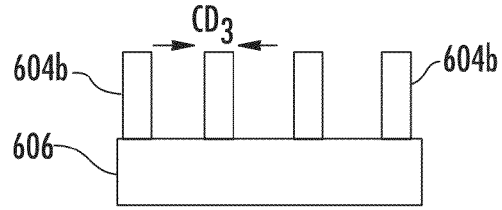

FIGS. 6A to 6C depict in very schematic fashion a side view of an MRAM structure that explains the behavior observed in FIG. 5. In FIG. 6A, a set of mask features 602, which may be a hard mask, is patterned on a blanket MRAM stack 604 (whose individual layers are not shown), which in turn is disposed on an oxide underlayer 606. As illustrated, the mask features 602 have a CD value $CD_1$, which may be the nominal or designed CD for MRAM pillars to be etched using the set of mask features. Subsequently etching is performed in order to define MRAM pillars in the MRAM stack 604. The structure of the MRAM pillars after a conventional etch is depicted in FIG. 6B. As illustrated the untreated MRAM pillars 608 exhibit a large redeposited layer 610 on sidewalls, which surrounds inner portions 604a, which may be undamaged and may have the actual desired $CD_1$ value defined by the mask features 602. This redeposited layer 610 causes the CD of the untreated MRAM pillars 608 to increase to a value of $CD_2$, which is larger than the $CD_1$ of the set of mask features 602.

Subsequently, the untreated MRAM pillars 608 are subject to treatment by angled ions consistent with the present embodiments, that is, ions that are provided to the pillars at a non-zero angle with respect to a perpendicular to the substrate plane (see plane 124 of FIG. 1). It is to be noted that the ions may be provided in a parallel fashion at a single non-zero angle of incidence or over arrange of angles of incidence that may be distributed about a nominal angle of incidence. Notably, the apparatus 200 is operative to adjust the spread of angles of incidence of ions extracted through the aperture 302. In some cases, the range of angles or incidence for ions may be distributed about a single angle, while in other cases the range of angles of incidence may be bimodal. For example, ions may be provided over a range of angles of incidence that have two modes, one at −30 degrees with respect to normal to a plane of the substrate and one at +30 degrees with respect to normal.

The treatment by angled ions causes a removal of redeposited layer 610 so as to reduce the CD of the treated MRAM pillars 604b (FIG. 6C), where a CD value of $CD_3$ that is less than $CD_2$ is produced. By tuning the dose of angled ions, the final CD of MRAM pillars to be formed can be optimized. Thus, sidewall residue resulting from etching of the MRAM pillars may be removed without excessive removal of original layer material 604a in the core of the MRAM pillar. As suggested by FIG. 5 an argon ion dose between 1E16 and 1E17 may be sufficient to produce MRAM pillars having the nominal CD value, that is, 0% change from the starting CD of the mask features. In cases where the target CD is to be less than that of the mask features, a higher dose of ion treatment may be appropriate. Thus, if CD is to be reduced by about 10%, a dose of ions of 1E17 may be appropriate. In exemplary processes, the ion energy for treatment of MRAM pillars to remove sidewall residue may be about 300 eV to 2000 eV, and in some instances about 750 eV. It is to be noted that the exact ion dose for treating MRAM pillars depends on the ion energy, pillar height and other factors.

In addition to adjusting the average CD of a pillar in a set of pillars, such as an in an MRAM array, in further embodiments, the variation in CD across a wafer may be reduced using angled ion treatment. In one implementation, the aperture 302 of system 200 is arranged as an elongated slot, as illustrated in the plan view of the sheath modifier 106 shown in FIG. 3. In order to expose the entire workpiece 100 to ions, the workpiece (wafer) 100 may be scanned with respect to aperture 302 along the X-direction of the Cartesian coordinate system shown. In this manner, MRAM pillars disposed throughout the workpiece 100 may be treated with angled ions to adjust the CD. In typical cases, after conventional etching to form MRAM pillars, the CD varies across the wafer (workpiece 100), such as between points A and B. In one embodiment, the variation of CD in MRAM pillars is adjusted by varying one or more parameters of the system 200 while scanning the workpiece 100 with respect to the aperture 302. For example, after etching to define the MRAM pillars, MRAM devices at point A may have a smaller CD than those at point B, and may therefore require less ion treatment than those at point B in order to reduce their CD to a target value. Accordingly, in one embodiment, a lower dose of ions may be provided at point A than at point B. In one variant, ion dose directed to different portions of the workpiece 100 may be adjusted by adjusting the scan rate as the workpiece is scanned along the X-direction. Thus, in the above example, a higher scan rate may be applied when the region of the workpiece proximate point A are exposed to the aperture 302 in order to provide a relatively lower total ion dose to each MRAM device proximate point A. When the workpiece 100 is scanned proximate point B, on the other hand, the scan rate may be slowed to provide a relatively higher total ion dose to MRAM devices proximate point B. The scan rate may be adjusted according to any desired function. For example, the scan rate may be adjusted as a function of relative position of aperture 302 to workpiece 100 to mimic the CD variation as a function of position on the workpiece 100. In various embodiments, a scan rate is between about 1 cm/s and 50 cm/s is effective in removing redeposited material from sidewalls and adjusting CD to a desired value.

In another variant in which ions are provided to the workpiece 100, the pulse duty cycle for ion pulses may be varied as the workpiece 100 is scanned with respect to the aperture 302. Thus, continuing with the above example, a lower duty cycle, that is, pulsing in which the "on" period of ions is relatively less per cycle, may be applied when scanning near point A, thereby providing a lower effective dose to MRAM structures near point A. The "on" period refers to an interval in a pulse cycle in which a plasma is both present in a source and a potential is applied between plasma and substrate so that ions are attracted to the substrate. A relatively higher duty cycle for the pulsed ions may be applied when scanning near point B to provide a relatively higher ion dose. In further variants, a combination of varying the scan rate of a workpiece and the duty cycle of pulsed ions may be applied to vary ion dose across a wafer to achieve a variable ion treatment across a wafer.

In additional embodiments, the selective removal of desired material from an etched MRAM pillar is accomplished by control of angle of incidence of ions on the MRAM pillars. Referring again to FIG. 4, it is seen that a hardmask layer 414 and a sidewall layer 424 of redeposited material are formed after conventional etching to form the pillars 412, such as MRAM pillars. Because the redeposited sidewall layer 424 may have a high concentration of magnetic layer material, such as CoPd in one example, while the hardmask layer 414 typically comprises a different material, such as TiN, it may be desirable to provide ion treatment that selectively removes the CoPd material with respect to TiN. In this manner, the sidewall regions can be effectively cleaned to remove any possible electrical shorting material, while the hard mask layer disposed on the top of the pillar is preserved, as may be desired or required for further processing of the MRAM device.

Figure 7A:
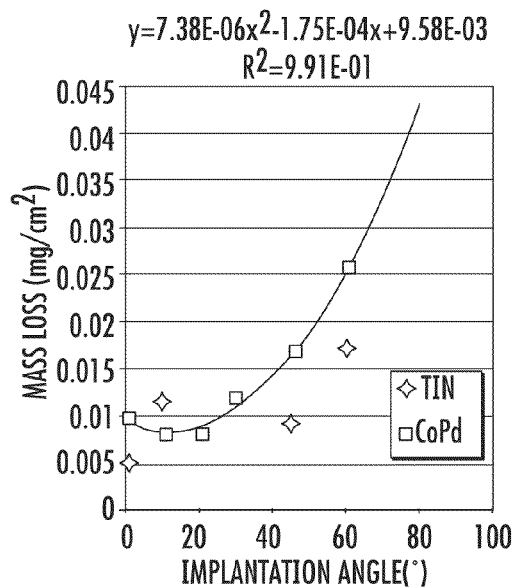
FIGS. 7A-7C depict data illustrating selective removal of magnetic material compared with hardmask material by control of angled ion treatment parameters.
Figure 7B:
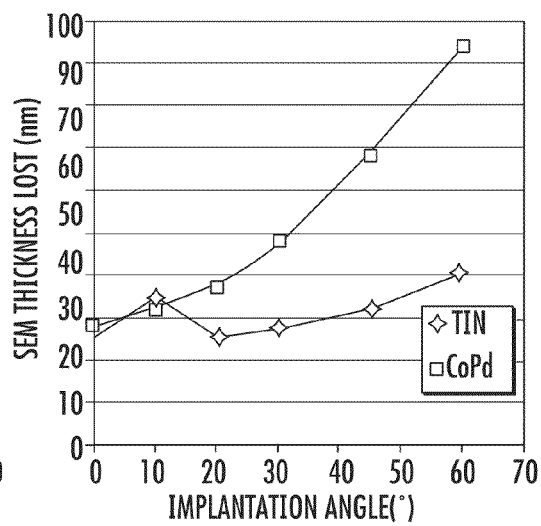
Figure 7C:
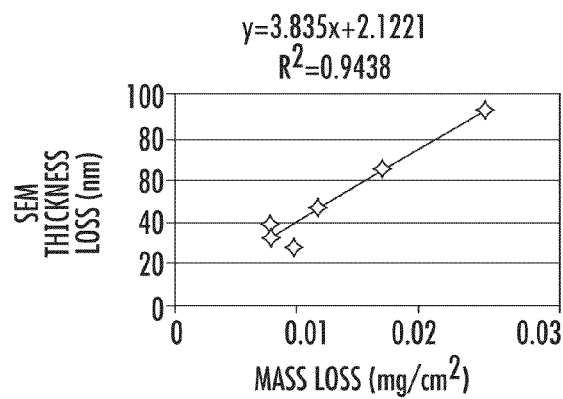

FIGS. 7A-7C depict experimental results that illustrate sputter rate dependence of different materials as a function of angle of incidence for blanket layers of different materials. The results demonstrate that the angle of incidence of ions directed at MRAM pillar structures may be tuned to optimize selective removal of sidewall residue with respect to hard mask material. FIG. 7A illustrates mass removal as a function of incidence angle for ions for TiN (diamonds) and CoPd (squares), FIG. 7B demonstrates thickness loss of a blanket layer as a function of incidence angle for ions for TiN (diamonds) and CoPd (squares), and FIG. 7C demonstrates a linear relation between thickness loss and mass loss. The angles of incidence are with respect to normal to a substrate plane of the blanket material. As illustrated at FIG. 7B, for example, at 60 degrees, 90 nm of CoPd is removed for a dose of 2E17 argon ions per square centimeter at an energy of 1.5 keV that is used in all the experimental data of FIG. 7B. When a CoPd layer is disposed vertically on a sidewall of a pillar, ions directed at 30 degrees with respect to perpendicular would be expected to remove CoPd at a similar rate as the blanket data of FIG. 7B in which the CoPd layer is disposed horizontally. Accordingly, if ions are directed at 30 degrees with respect to perpendicular to a wafer having a layer of TiN disposed on the top of a pillar structure, 30 nm of TiN may be removed, while about 90 nm of CoPd is removed for the same conditions. Thus, a 3:1 selectivity is achieved at 30 degrees with respect to normal for etching CoPd from sidewalls as compared to etching TiN from a top of a pillar structure.

In additional embodiments, the use of other angles of incidence may be appropriate for treating pillar structures. For example, in addition to tuning the selectivity between etching of metallic material on sidewalls and a hardmask layer on the top of a pillar, in father embodiments, the angle of ions may be adjusted to optimize selectivity for cleaning the bottom (trench) regions between pillars as opposed to the sidewalls. For example, providing ions at a zero degree angle of incidence, that is, a perpendicular incidence with respect to the substrate plane (along the Z-direction of FIG. 2), may allow ions to etch conductive residue in bottom regions 426 selectively over material in the sidewall. Notably, for vertical sidewalls, a zero degree angle of incidence has sputter yield that is theoretically zero. Thus, the bottom region 426 conductive residue may be preferentially sputtered as opposed to material deposited on vertical sidewalls. Even if sidewalls are not vertical, the sputter yield at grazing incidence, for example, for material deposited along sloped sidewalls having an angle less than thirty degrees with respect to normal, is typically much lower compared to that at normal incidence experienced by the material in bottom region 426.

In additional embodiments, and referring again to FIG. 3, wafer rotation is performed in conjunction with treatment of MRAM structures by angled ions. This may be particularly effective in avoiding redeposition on sidewalls during the sidewall "cleaning" process in which angled ions are directed toward the MRAM pillars. For example, a workpiece 100 is rotated in the X-Y plane of FIG. 3 to different positions at which positions ions are then provided toward the workpiece, as shown generally at FIG. 2 and FIG. 4. In one embodiment, a workpiece with MRAM pillar structures is rotated between four different angular positions: 0, 90, 80, and 270 degrees. In each angular position the workpiece is exposed to a dose of ions to remove unwanted residue from the pillar structure.

Figure 8A:
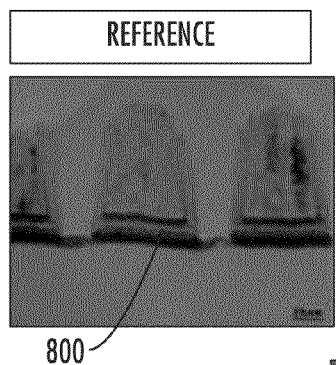
FIGS. 8A to 8E present cross sections of pillar structures that illustrate the effect of combining angled ion treatment with wafer rotation.
Figure 8B:
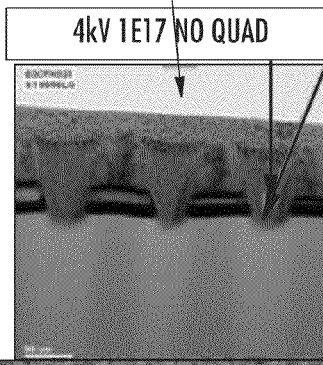
Figure 8C:
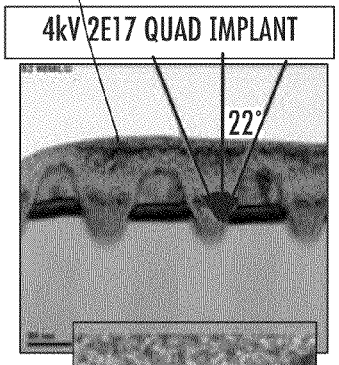
Figure 8D:

FIGS. 8A to 8E present cross sections of MRAM pillar structures that illustrate the effect of combining angled ion treatment with wafer rotation. FIG. 8A depicts a reference MRAM pillar structure 800 before ion treatment to remove residue. FIGS. 8B and 8D depict an MRAM pillar structure 810 after a dose of 1E17 ions are provided to the MRAM pillars at 4 keV ion energy along a single direction that forms an angle of incidence of 22 degrees with respect to a perpendicular to the plane of the wafer. The ions are provided by a beamline apparatus in this case as well as in the examples illustrated in FIGS. 8C, 8E, though a system such as that illustrated in FIGS. 1-3 also may be used. FIG. 8D illustrates a close-up of the MRAM pillar structures 810 depicted in FIG. 8B. As seen particularly in FIG. 8D, the (MRAM) pillar 812 exhibits a significant redeposited sidewall region 814 on one side of the pillar 812. This redeposited sidewall region 814 may represent material redeposited during the single exposure to a dose of 1E17 ions and may also represent material originally redeposited during etching to form the pillar 812. In either or both cases, a single exposure to ions at a single angle of incidence without wafer rotation results in a large redeposited sidewall region 814, which may create electrical shorting, or otherwise compromise device performance.

Figure 8E:
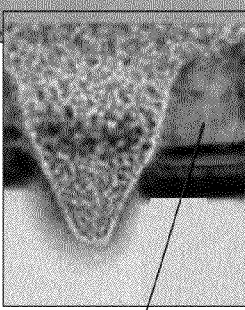

FIGS. 8C and 8E present pillars 820 that show the results of combining ion treatment with wafer rotation consistent with the present embodiments. In the examples shown, an ion dose of 2E17 is provided at an angle of incidence of 22 degrees with respect to perpendicular to the plane of the wafer at each of four different rotational positions of the wafer that are 0, 90, 180, and 270 degrees. As is evident in the close-up view depicted in FIG. 8E, there is no redeposited sidewall observed along either side of the pillar 812.

Figure 9A:
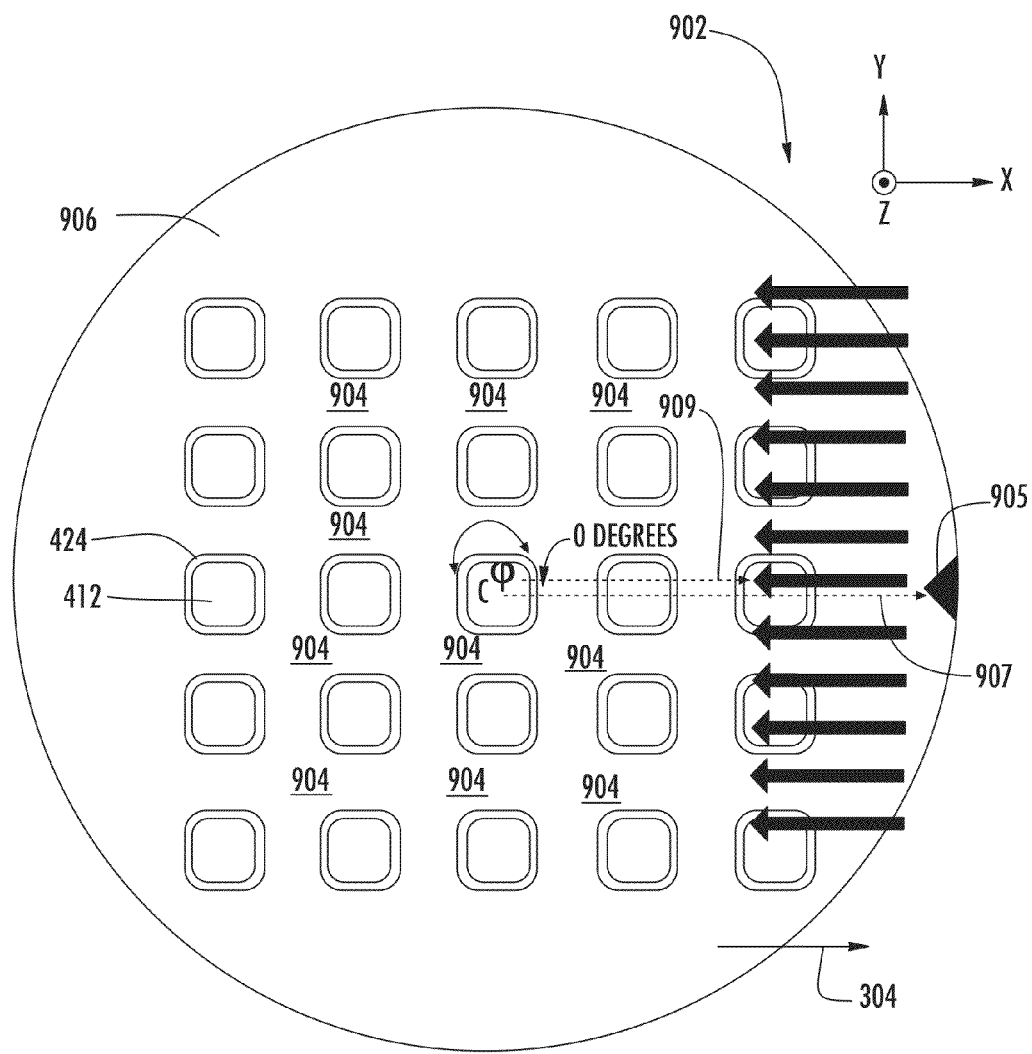
FIGS. 9A to 9C depict an arrangement for cleaning conductive residue in trench regions consistent with the present embodiments.
Figure 9B:
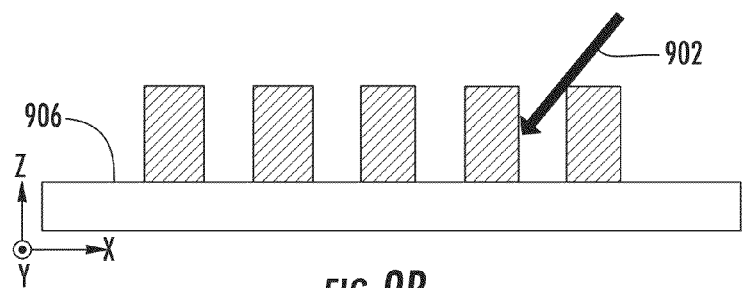
Figure 9C:
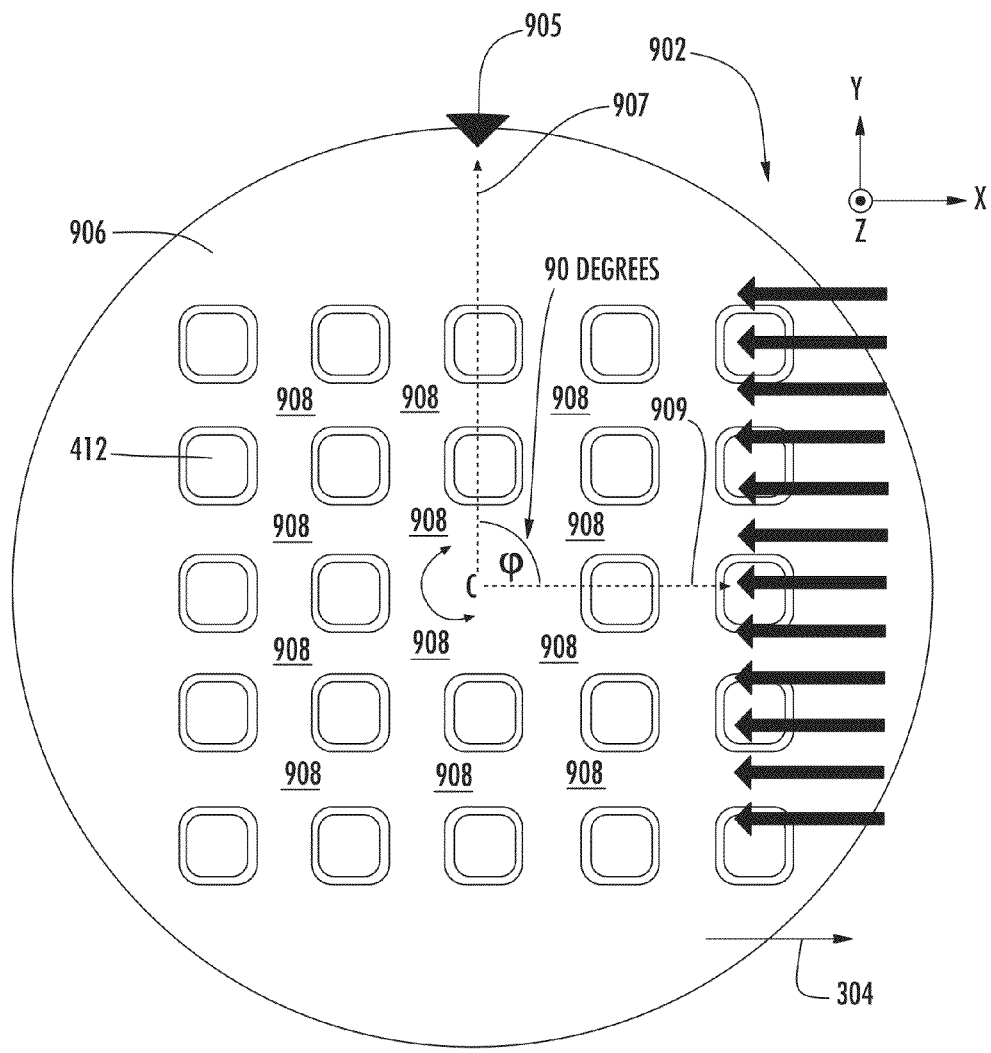

Wafer rotation may also be employed to clean conductive residue in the bottom portions 426 formed at the bottom of trench regions 428 between pillars as detailed in FIGS. 9A-9C. For example, the wafer may be rotated within the plane of the wafer between different in-plane angles φ, which are hereinafter referred to as rotational angles. In the example of FIGS. 9A-9C, the plane of the wafer is the X-Y plane for the Cartesian coordinate system shown. In this manner ions may reach the bottom of trenches even if the ions are directed at an angle of incidence with respect to perpendicular to the plane of the wafer. For example, an arrangement of MRAM cells may be defined by a two dimensional array of pillars that have multiple rows of pillars that define elongated trenches that extend for long distances between adjacent rows of pillars. In an orthogonal array, a first set of trenches may extend along a first rotational angle and a second set of trenches may extend along a second rotational angle orthogonal to the first rotational angle. The wafer containing such arrays may be rotated such that the angled ions are directed parallel to the elongated trenches and are therefore effective in etching the trenches.

FIGS. 9A to 9B illustrate one scenario in which a beam of ions 902 are directed to a substrate (portion) 906 in a first exposure along a first direction parallel to the y-axis and forming an angle with respect to the z-axis. As shown in FIG. 9A, the substrate 906 may be scanned along the direction 214 so that the entire substrate is exposed to the ions 902. The ions 902, in addition to removing material from sidewalls of pillars 412, are therefore effective in cleaning a first set of trenches 904 oriented along the y-direction. As suggested in FIG. 9A, the substrate 906, which lies within the X-Y plane may be rotated in the X-Y plane through different rotational angles φ to provide ions at a different rotational direction with respect to given features of the substrate. In particular, the rotational angles φ are defined with respect to a plane that is perpendicular to the X-Y plane, such as the X-Z plane. In the scenario of FIGS. 9A-9C the ions 902 are provided along the same direction parallel to the X-axis. As shown in FIG. 9A, a radius 907 between the substrate notch 905 and center C is parallel to the X-Z plane. When the substrate 906 is rotated within the X-Y plane, the notch 905 rotates. In this manner, although the absolute direction of the ions 902 may not change between FIGS. 9A and 9C, the ions 902 may be oriented parallel to different features of the substrate 906 such as different trenches when the rotational angle φ changes.

The value of the rotational angle φ may be defined as the value of an angle between a line that lies within the plane of the substrate 906 and a plane perpendicular to the plane of the substrate, e.g., the X-Z plane. One example of a line that lies within the substrate plane is the radius 907 that connects the center C to a particular wafer point, such as the notch 905. In the particular example of FIG. 9A, because the radius 907 is parallel to the X-Z plane and thereby parallel to the trajectory of ions 902 (a dashed line 909 is extended parallel to the ions 902 for clarity), the substrate 906 may be deemed to be oriented at a rotational angle φ of zero degrees.

FIG. 9C illustrates another instance in which the substrate 906 is rotated 90 degrees with respect to the scenario of FIG. 9A constituting a rotational angle φ of ninety degrees, which defines the angle between the radius 907 and the trajectory of ions 902 (or X-axis in this case). Thus, ions 902 are directed parallel to trenches 908 that are orthogonal to those exposed trenches 904 that are impacted by the ions 902 in FIG. 9A. In various embodiments, as noted, the substrate may be rotated through a series of four different rotational angles φ at 90 degree increments so that all sets of sidewalls are exposed to the ions 902. In this manner material may be effectively removed from sidewalls and trenches. In some embodiments, a substrate may be exposed multiple times to ions a given rotational orientation. In so doing the removal of material from sidewalls and trench bottoms may be optimized to ensure that redeposition of material etched from a given sidewall or trench is prevented.

Consistent with further embodiments, in embodiments in which ions are provided to a workpiece as a ribbon beam (see, e.g., FIG. 3), the overall scan speed for scanning a workpiece (wafer) with respect to a beam of ions is optimized to promote cleaning of residue from sidewalls, as well as residue in trench regions between pillars (see conductive residue in bottom region 426 in FIG. 4). In conjunction with optimizing scan speed, the duty cycle of pulsed ions may be adjusted. In one instance, the present inventors have observed that scan speeds below 10 mm/s are more effective in cleaning sidewalls of MRAM pillar structures than relatively higher scan speeds. This may be attributed, among other factors, to the relatively greater number of ions provided to a given pillar at the lower scan speeds. In contrast, scan speeds above 100 mm/s may be less effective in cleaning etch residue present on pillar structures. It is to be noted that the range of scan speeds that may best clean a given device structure is dependent on the amount of residue produced by a given etch process to form the pillar, as wells as the ion energy, ion density, and type of ion used to provide residue cleaning. Thus, in some cases higher scan speeds, such as 20 or 50 mm/s may be effective in removing etch residue.

In still further embodiments, ion beam treatment, such as angled ion treatment, may be provided to a pillar structure to passivate the pillar structure. For example, after cleaning etch residue from pillar sidewalls and trench regions between pillars of an MRAM pillar array, the MRAM pillars may have metal layers that are exposed to ambient along the sidewalls of the pillars, which allows unwanted chemical attack of such pillars, thereby potentially compromising the stability and performance of such MRAM devices.

Figure 10A:
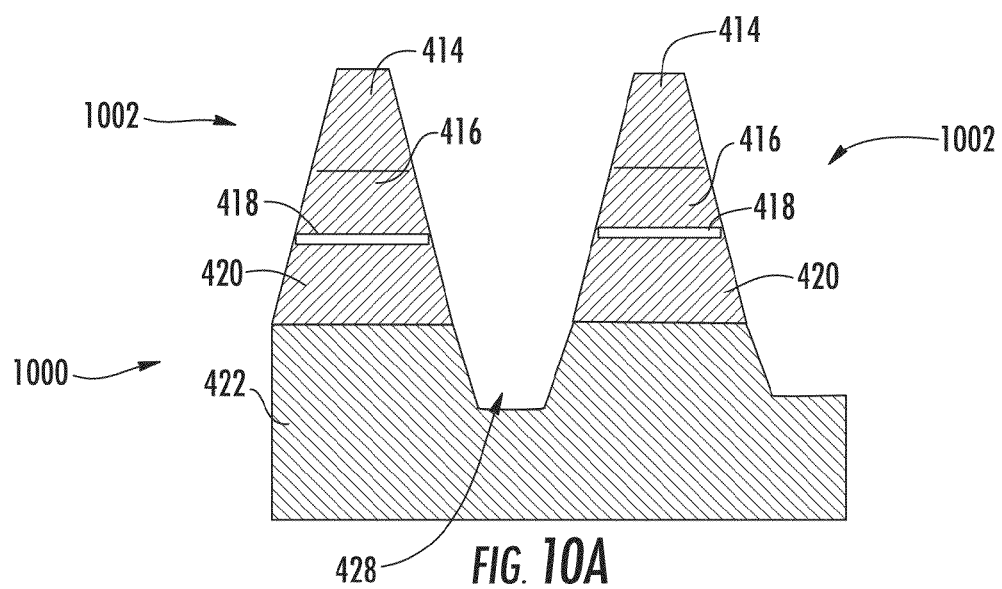
FIGS. 10A to 10B depict passivation of pillar sidewalls using angled ion treatment consistent with the present embodiments.

FIG. 10A depicts an MRAM pillar structure 1000, which may represent the state of an MRAM device after treatment by angled ions to remove etch residue created during etching to form the MRAM pillars. As evident, no conductive residue is present in trench regions 428, and the cleaned pillars 1002 exhibit no redeposited sidewall layer 424. However, the top magnetic layer 416 and bottom magnetic layer 420 are now open to attack along the sidewall regions.

Figure 10B:
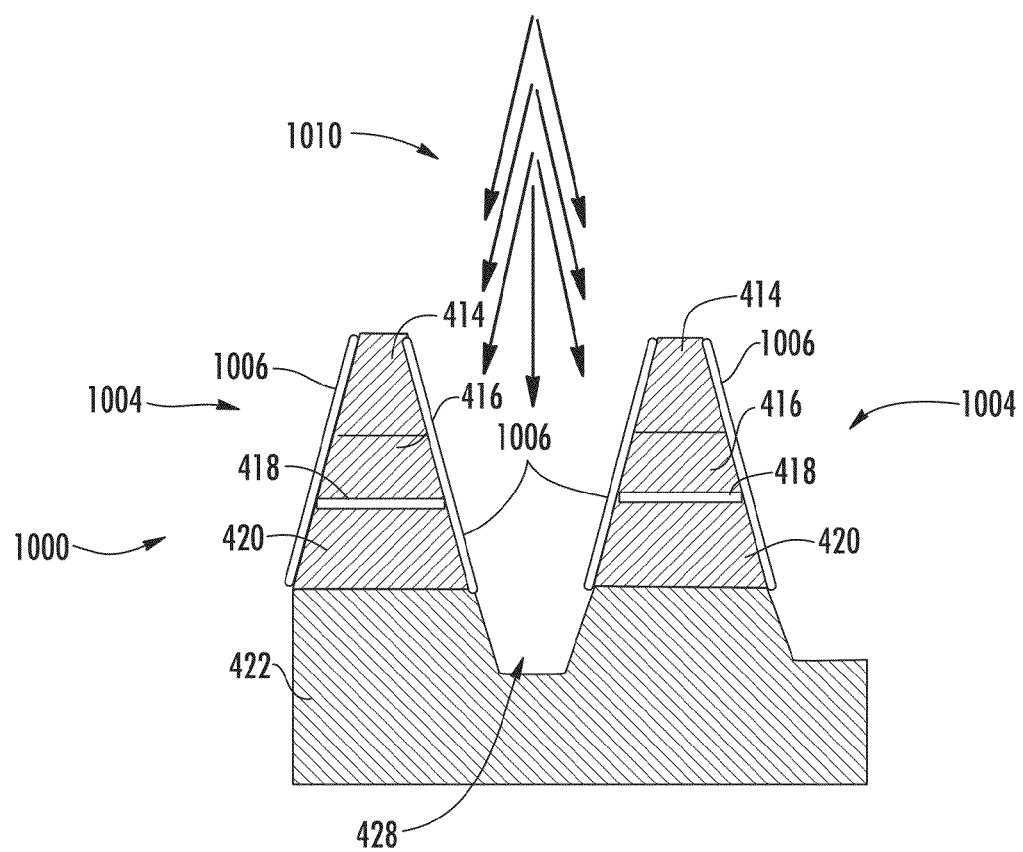

FIG. 10B presents the structure of FIG. 10A after treatment with angled ions 1010 to passivate the pillar structure. As evident, a set of passivation layers 1006 has formed on the MRAM pillars forming passivated MRAM pillars 1004. In various embodiments, the passivation layers may be an oxide or a nitride material that is formed by exposure to oxygen or nitrogen ions, respectively. In some instances, the ion energy to form the passivation layers 1006 may be 300 eV to 3000 eV, which may form a layer having a thickness of about 5 nm or less, in some cases.

In additional embodiments, combinations of ion treatments that are generally disclosed hereinabove are applied to a device structure to optimize device processing. As previously noted, several outstanding problems are yet to be fully addressed for manufacturing MRAM devices, including the ability to clean pillar sidewall residue and bottom (or trench) residue between pillars, the ability to control MRAM pillar CD, and the need to passivate MRAM pillar structures.

In accordance with various methods of the present embodiments, a multi-step ion beam process for treating a device pillar structure includes a series of ion treatments in which the ion beam conditions vary between treatments. The ion beam conditions for each treatment are tailored to optimize that treatment for a specific purpose, such as sidewall residue removal, CD control, sidewall passivation, and the like. For example, one or more of the ion beam chemistry, ion beam energy, ion beam angle of incidence, and ion dose is varied between successive treatments so that each treatment is tailored for a different purpose.

In one embodiment a sequence of ion treatments is provided in the following order: 1) perform first ion treatment for cleaning residue from bottom (trench) regions; 2) perform second ion treatment for cleaning pillar sidewalls to remove residue; 3) perform third ion treatment to passivate sidewalls using oxygen and/or nitrogen ions. The implant angle between the first and second ion treatments in this or other embodiments may vary such that either the sidewalls or the trench bottom regions (see bottom region 426) located at the bottom of trenches between pillars are predominantly cleaned. For example, ions directed along (zero degrees with respect to) the perpendicular to a substrate plane (along the Z-axis of FIG. 9B, for example) may be particularly effective to remove material from trench bottoms because the ions are not shadowed by adjacent pillars. On the other hand, ions directed along the perpendicular to a substrate may have little or no cleaning effect on sidewall layers especially if the sidewalls are perpendicular to the substrate plane. The angle distribution (e.g., parallel and normal incidence versus bimodal and angled incidence) also may vary between the first and second ion treatments such that the sidewalls or trench bottom region are predominantly cleaned.

In another embodiment a sequence of ion treatments is provided in the following order: 1) perform first ion treatment for cleaning pillar sidewalls to remove residue; 2) perform second ion treatment for cleaning residue from bottom (trench) regions; 3) perform third ion treatment to passivate sidewalls using oxygen and/or nitrogen ions.

In a further embodiment a sequence of ion treatments is provided in the following order: 1) perform first ion treatment for cleaning residue from bottom (trench) regions; 2) perform second ion treatment to adjust the CD of pillars; 3) perform third ion treatment for cleaning pillar sidewalls to remove residue; 4) perform fourth ion treatment to passivate sidewalls using oxygen and/or nitrogen ions. Of course, the exact sequence of steps in this or other embodiments may vary.

In one specific example ions having a higher energy and incident at angle A are provided to clean the bottom regions between pillars, while ions having a lower energy and incident at an angle B that is less than A are used to clean the sidewalls of pillars. In addition, the dose of ions is optimized to obtain the desired CD for the treated pillars. Subsequently, nitrogen and/or oxygen ions are provided at an angled implantation effective to passivate the sidewalls. It is to be noted that the nitrogen and/or oxygen may be provided from sources that contain nitrogen/oxygen and need not be gaseous nitrogen or oxygen.

It is to be further noted that depending on the sequence of ion treatment, the exact conditions for a given treatment may be adjusted. Thus, if a sidewall clean is done before a trench clean, the ion dose for the sidewall clean may be adjusted upwardly or downwardly as appropriate in comparison to a sequence of ion treatments in which a trench clean is performed before a sidewall clean.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although the disclosed embodiments focus on MRAM device structures, the present embodiments cover any patterned features in which the features include a stack of different layers in which metal layers may be included. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of treating a sidewall layer of a patterned feature, comprising:

providing the patterned feature as an etched structure comprising one or more layers disposed on a substrate and generally parallel to a plane of the substrate defined by a front surface of the substrate, the sidewall layer comprising material from at least one of the layers;

arranging the substrate proximate a sheath modifier that is adjacent a plasma; and providing ions in an ion dose to the substrate by extracting the ions from the plasma through the sheath modifier, the ions impinging upon the substrate at an angle with respect to a perpendicular to the plane of the substrate, wherein one or more of the etched layers are metallic, and wherein the sidewall layer is a metallic layer or metal-rich layer.

2. The method of claim 1, wherein the sidewall layer is disposed at an angle of less than about forty degrees with respect to a perpendicular to the plane of the substrate.

3. The method of claim 1, wherein the patterned feature has a top layer that is exposed to the ions during the ion dose, wherein the ion dose is effective to etch the sidewall layer at a faster etch rate than the top layer.

4. The method of claim 1, wherein the ion dose is a first ion dose, the method further comprising:

arranging the substrate at a first rotational angle while providing the ion dose; and arranging the substrate at a second rotational angle while providing a second ion dose, the ions impinging upon the substrate at an angle with respect to a perpendicular to a plane of the substrate during the second ion dose, wherein the first and second rotational angles each comprises an angle between a line within the plane of the substrate and a plane perpendicular to the plane of the substrate.

5. The method of claim 4, wherein the substrate includes a two dimensional array of patterned features that define first and second sets of trenches that are oriented along the respective first and second rotational angles.

6. The method of claim 1, wherein the ion dose is a first ion dose, the method further comprising providing, after the first ion dose, ions in a second ion dose to the substrate at an angle with respect to the perpendicular to the plane of the substrate, the second ion dose effective to generate a passivating layer on sidewalls of the patterned feature.

7. The method of claim 6, wherein the second ion dose comprises oxygen and/or nitrogen ions having an energy between about 300 eV and 3000 eV.

8. The method of claim 1, further comprising:

scanning the substrate with respect to the sheath modifier during a time interval of the ion dose;

providing the ion dose as ion pulses defined by an ion duty cycle; and varying an "on" period of ion pulses during the scanning.

9. The method of claim 1, wherein the ion dose is a first ion dose and the substrate includes a two dimensional array of patterned features, the method further comprising: providing, after the first ion dose, ions in a second ion dose to the substrate along the perpendicular to the plane of the substrate, the second ion dose effective to remove residue from trench bottom regions between patterned features.

10. The method of claim 9, further comprising providing, after the second ion dose, ions in a third ion dose to the substrate at an angle with respect to the perpendicular to the plane of the substrate, the third ion dose effective to generate a passivating layer on sidewalls of the patterned features.

11. The method of claim 1, wherein the patterned feature comprising a magnetic random access memory (MRAM) cell arranged in an array of magnetic random access memory cells, the sidewall layer comprising one or more of Pt, Cr, Mn, Co, Fe, and Ta.

12. A method of treating an array of patterned features on a substrate, comprising:

providing the array of patterned features as a plurality of etched layers generally parallel to a plane of the substrate defined by a front surface of the substrate, each patterned feature bounded by a metallic sidewall layer comprising material from the plurality of etched layers;

arranging the substrate proximate a sheath modifier that is adjacent a plasma; and providing ions in an ion dose to the substrate by extracting the ions from the plasma through the sheath modifier, the ions impinging upon the substrate at an angle with respect to a perpendicular to the plane of the substrate, wherein the sidewall layer is removed from the array of patterned features.

13. The method of claim 12, wherein the sidewall layer is disposed at an angle of less than about forty degrees with respect to the perpendicular to the plane of the substrate.

14. The method of claim 12, wherein the patterned feature having a top layer that is exposed to the ions during the ion dose, wherein the ion dose is effective to etch the sidewall layer at a faster etch rate than the top layer.

15. The method of claim 12, wherein the ion dose is a first ion dose, the method further comprising:

arranging the substrate at a first rotational angle while providing the first ion dose; arranging the substrate at a second rotational angle while providing a second ion dose, the ions impinging upon the substrate at an angle with respect to a perpendicular to a plane of the substrate during the second ion dose, wherein the first and second rotational angles each comprises an angle between a line within the plane of the substrate and a plane perpendicular to the plane of the substrate.

16. The method of claim 12, wherein the ion dose is a first ion dose, the method further comprising providing, after the first ion dose, ions in a second ion dose to the substrate at an angle with respect to the perpendicular to the plane of the substrate, the second ion dose effective to generate a passivating layer on sidewalls of the patterned feature.

17. The method of claim 12, wherein the array of patterned features comprising a magnetic random access memory (MRAM) arranged in an array of magnetic random access memory cells, the sidewall layer comprising one or more of Pt, Cr, Mn, Co, Fe, and Ta.

* * * * *